United States Patent
Nyhus et al.

(12) (10) Patent No.: US 9,054,215 B2
(45) Date of Patent: Jun. 9, 2015

(54) PATTERNING OF VERTICAL NANOWIRE TRANSISTOR CHANNEL AND GATE WITH DIRECTED SELF ASSEMBLY

(71) Applicants: Paul A. Nyhus, Portland, OR (US); Swaminathan Sivakumar, Beaverton, OR (US)

(72) Inventors: Paul A. Nyhus, Portland, OR (US); Swaminathan Sivakumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 357 days.

(21) Appl. No.: 13/719,113

(22) Filed: Dec. 18, 2012

(65) Prior Publication Data
US 2014/0170821 A1 Jun. 19, 2014

(51) Int. Cl.
| | | |
|---|---|---|
| H01L 21/8234 | (2006.01) | |
| H01L 29/78 | (2006.01) | |
| H01L 29/775 | (2006.01) | |
| H01L 29/66 | (2006.01) | |
| B82Y 10/00 | (2011.01) | |
| B82Y 40/00 | (2011.01) | |
| H01L 29/423 | (2006.01) | |
| H01L 29/06 | (2006.01) | |
| H01L 29/16 | (2006.01) | |

(52) U.S. Cl.
CPC ... *H01L 21/823487* (2013.01); *H01L 29/66666* (2013.01); *H01L 29/7827* (2013.01); *B82Y 10/00* (2013.01); *B82Y 40/00* (2013.01); *H01L 29/42376* (2013.01); *H01L 29/775* (2013.01); *H01L 29/0676* (2013.01); *H01L 29/16* (2013.01)

(58) Field of Classification Search
CPC .............. H01L 29/7827; H01L 21/823487
USPC ................. 257/E21.41, E21.629, 329
See application file for complete search history.

(56) References Cited

U.S. PATENT DOCUMENTS

| | | | |
|---|---|---|---|
| 6,921,700 B2 | 7/2005 | Orlowski et al. | |
| 7,285,829 B2 | 10/2007 | Doyle et al. | |
| 7,666,727 B2 | 2/2010 | Doyle et al. | |
| 7,781,771 B2 | 8/2010 | Lindert et al. | |
| 8,294,180 B2 | 10/2012 | Doyle et al. | |
| 2008/0099845 A1* | 5/2008 | Yang et al. | 257/351 |
| 2010/0059807 A1 | 3/2010 | Cho et al. | |
| 2010/0276669 A1 | 11/2010 | Richter et al. | |
| 2010/0295021 A1 | 11/2010 | Chang et al. | |
| 2013/0240983 A1* | 9/2013 | Larrieu | 257/329 |

FOREIGN PATENT DOCUMENTS

| | | |
|---|---|---|
| KR | 10-2003-0050997 A | 6/2003 |
| KR | 10-2005-0019468 A | 3/2005 |
| KR | 10-2009-0054472 A | 5/2009 |

OTHER PUBLICATIONS

International Search Report and Written Opinion mailed Sep. 25, 2013 for PCT/US2013/046899 filed Jun. 20, 2013.
International Application No. PCT/US2011/065916 filed Dec. 19, 2011, titled, "High Voltage Field Effect Transistors," 41 pages.
International Search Report and Written Opinion for Application No. PCT/US2011/065916 dated Sep. 25, 2012, 7 pages.

* cited by examiner

*Primary Examiner* — Ha Tran T Nguyen
*Assistant Examiner* — Aaron Dehne
(74) *Attorney, Agent, or Firm* — Blakely, Sokoloff, Taylor & Zafman LLP

(57) ABSTRACT

Directed self-assembly (DSA) material, or di-block co-polymer, to pattern features that ultimately define a channel region a gate electrode of a vertical nanowire transistor, potentially based on one lithographic operation. In embodiments, DSA material is confined within a guide opening patterned using convention lithography. In embodiments, channel regions and gate electrode materials are aligned to edges of segregated regions within the DSA material.

23 Claims, 12 Drawing Sheets

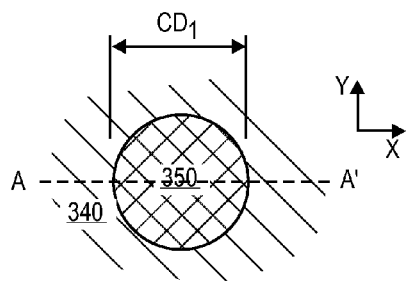
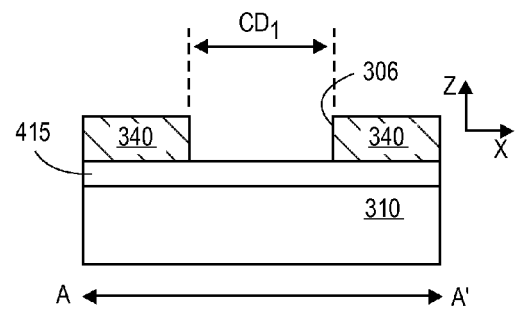
FIG. 5A
FIG. 6A
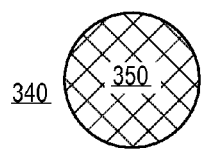
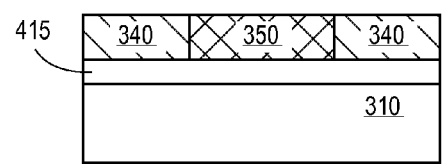
FIG. 5B
FIG. 6B
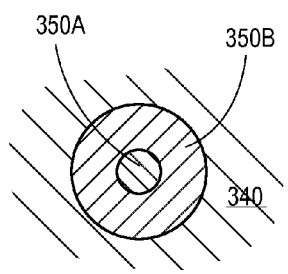
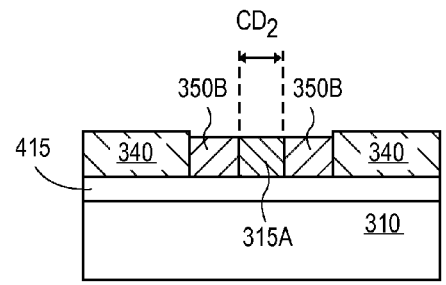
FIG. 5C
FIG. 6C

US 9,054,215 B2

PATTERNING OF VERTICAL NANOWIRE TRANSISTOR CHANNEL AND GATE WITH DIRECTED SELF ASSEMBLY

TECHNICAL FIELD

Embodiments of the invention generally relate to transistor fabrication for microelectronics, and more particularly pertain to patterning of a vertical nanowire transistor using directed self-assembly (DSA).

BACKGROUND

In vertically oriented transistors, well-controlled material layer thickness define functional lengths, such as gate length ($L_g$), and material composition may be advantageously tailored to achieve band gap and mobility differentiation. Current drive can also be continuously scaled by lithographic patterning of the channel width ($W_g$) and corresponding cross-section of the nanowire. However, in practical applications, one may need to print nanowire features (e.g., holes) on the order of 15 nm or less in diameter while having very good critical dimension (CD) uniformity, good circularity, and of minimal feature pitch for highest density. In addition the channel pattern must be accurately aligned to the gate stack and contact metallization.

Lithographic printing of holes less than 15 nm with sufficient CD uniformity, circularity, and pitch is beyond the capability of known ArF or EUV resist. Techniques whereby holes are printed larger and then shrunk fail to achieve desired pitches (e.g., <30 nm). Such pitches are also below the resolution of even two mask patterning techniques, and as such would require at least three mask patterning steps along with a very aggressive shrink process employing an expensive lithography toolset.

Techniques to pattern a vertical nanowire transistor to dimensions below 15 nm and pitches below 30 nm, which are manufacturable at lower cost are therefor advantageous.

BRIEF DESCRIPTION OF THE DRAWINGS

Embodiments of the present invention are illustrated by way of example, and not limitation, in the figures of the accompanying drawings in which:

FIGS. 5A, 5B, 5C, 5D, 5E, and 5F illustrate plan views of single-channel structures formed as operations in the method of FIG. 2 are performed, in accordance with an embodiment;

FIGS. 6A, 6B, 6C, 6D, 6E, and 6F illustrate cross-sectional views of the structures illustrated in FIG. 5A-5D, in accordance with an embodiment;

DETAILED DESCRIPTION

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" or "in one embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not structurally or functionally exclusive of the other.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Figure 1:
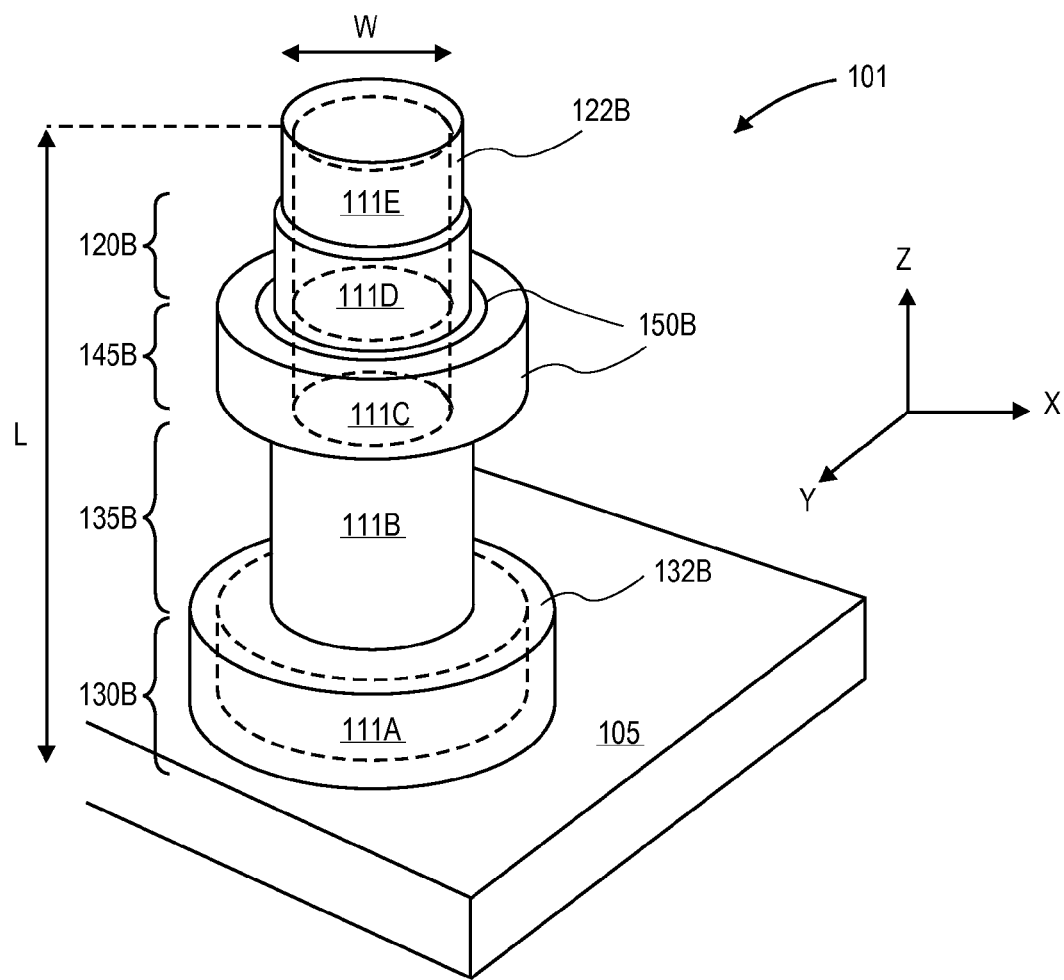
FIG. 1 is an isometric illustration of a vertical nanowire transistor, in accordance with an embodiment.

FIG. 1 is an isometric illustration of an exemplary vertical nanowire transistor 101, which may be fabricated in accordance with embodiments of the present invention. For the vertical nanowire transistor 101, a semiconductor nanowire is vertically oriented with respect to the substrate 105 so that the longitudinal length L is along the z dimension (perpendicular to a surface plane of the substrate 105) and the width W defines an area of the substrate 105 occupied by the nanowire. As for a laterally oriented transistor, the vertical transistor 101 comprises one or more semiconductor materials along the longitudinal length L corresponding to functional regions of the transistor including the channel region 145B disposed between an extrinsic source/drain region 135B, source/drain region 130B and source/drain region 120B. Depending on the embodiment a drain of the transistor 101 may be "down," on the substrate 105, or the transistor may be inverted to have "source down." In the vertical form, the transistor 101 has critical dimensions, such as channel length and $L_g$ (i.e., portions of the longitudinal length L) defined by material layer thickness, which can be very well-controlled (e.g., to 5-10 Å) by either epitaxial growth processes, implantation processes, or deposition processes.

Generally, substrate 105 and the first and second semiconductor material layers 111C, 111B may be any known in the art including group IV materials (e.g., Si, Ge, SiGe), III-N materials (e.g., GaN, AlGaN, etc.), or group III-V materials (e.g., InAlAs, AlGaAs, etc.). The drain/source regions 130B, 120B are of semiconductor material layers 111A, 111D, which may be the same material as for the channel region 145B, or a different material. The source/drain contact 122B may include a semiconductor 111E disposed on the source/drain region 120, such as a p+ tunneling layer and/or a highly doped (e.g., n+) low band gap capping layer. A low resistivity ohmic contact metal may further be included in the source contact 122B.

The transistor 101 includes a gate stack 150B coaxially wrapping completely around the nanowire within the channel region 145B. Similarly, the source/drain contacts 122B and 132B are also illustrated as coaxially wrapping around the source/drain regions 120B, 130B, though they need not. Disposed between the gate stack 150B, a first dielectric spacer (not depicted) is disposed on the source/drain contact 132B and coaxially wraps completely around the extrinsic source/drain region 135B along a first longitudinal length. A second dielectric spacer 156 is disposed on the gate stack 150B and coaxially wraps completely around the source/drain region 120B along a second longitudinal length with the source/drain contact 132B disposed on the second dielectric spacer.

Figure 2:
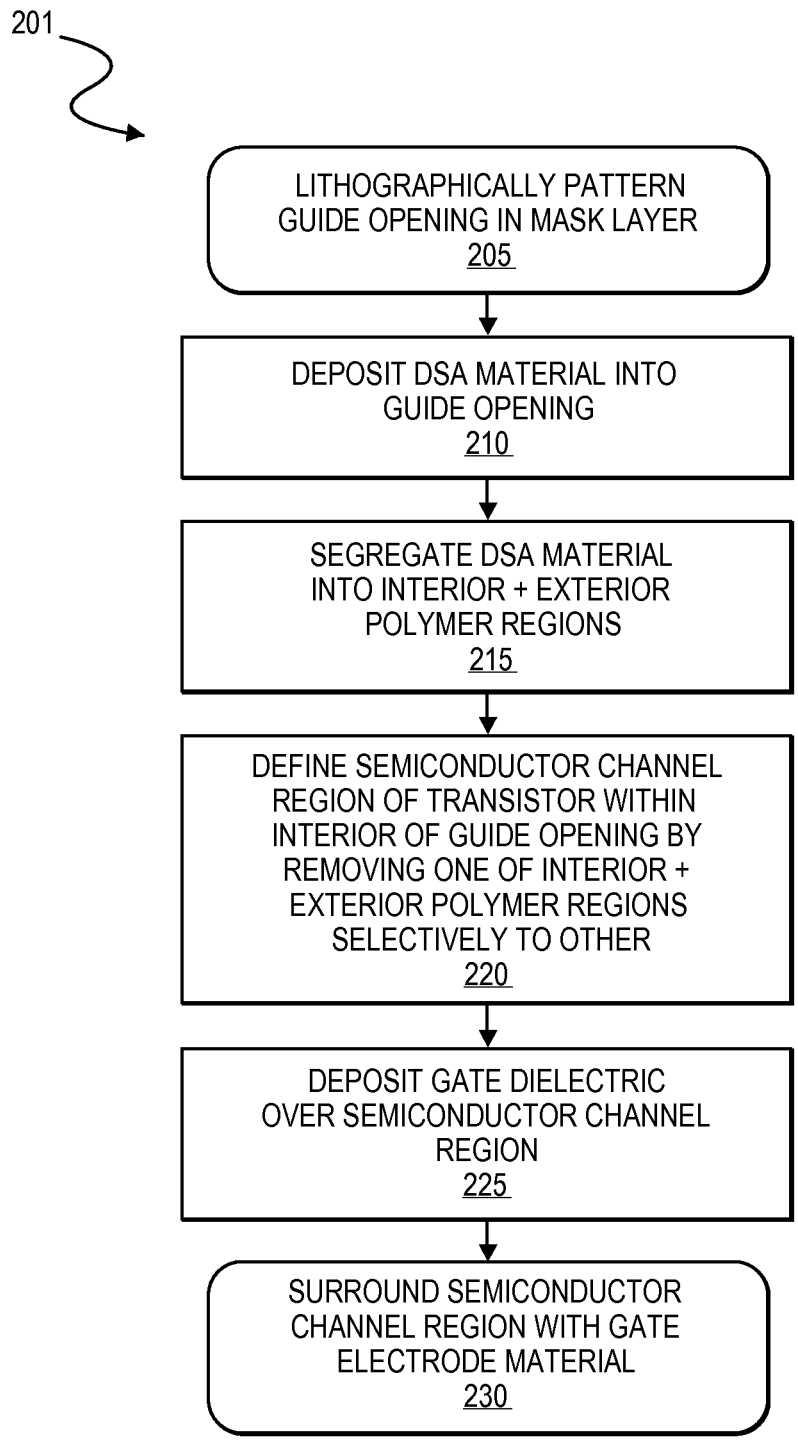
FIG. 2 is a flow diagram illustrating a method of forming a vertical nanowire transistor, in accordance with an embodiment.

FIG. 2 is a flow diagram illustrating a method 201 of forming a vertical nanowire transistor, such as the transistor 101, in accordance with an embodiment. Generally, the method 201 entails employing a directed self-assembly (DSA) material, such as a di-block co-polymer, to pattern features that ultimately define a channel region of a vertical nanowire transistor based on one lithographic operation, potentially without need for a scanner.

The method 201 begins with lithographically patterning a guide opening in a mask layer at operation 205. The guide opening is to provide an edge that a DSA material aligns to, and is more particularly a closed polygon, and advantageously curved, and more particularly circular. Any number of guide openings may be concurrently printed at operation 205, for example a 1-D or 2-D array of guide openings may be printed using any conventional lithographic process know in the art. As used herein, a 1-D array entails a row or column of guide openings with minimum pitch between adjacent ones in the row or column dimension and more than minimum pitch between adjacent rows or columns, while a 2-D array entails rows and columns of guide openings with minimum pitch between all guide openings in both row and column dimensions. The size and shape of the guide can be changed to allow more than one channel hole to be patterned in a given guide layer opening as for example FIG. 7b.

Figure 3A:
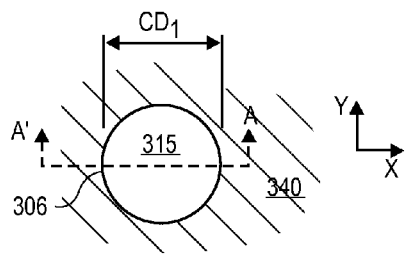
FIGS. 3A, 3B, 3C, 3D, and 3E illustrate plan views of single-channel structures formed as operations in the method of FIG. 2 are performed, in accordance with an embodiment.
Figure 4A:
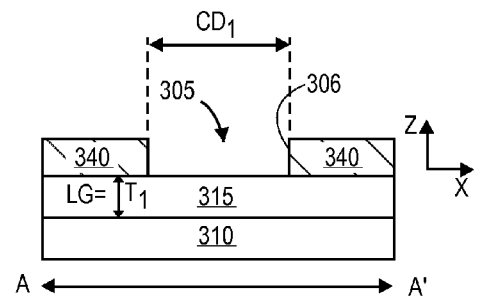
FIGS. 4A, 4B, 4C, 4D, and 4E illustrate cross-sectional views of the structures illustrated in FIG. 3A-3E, in accordance with an embodiment.

FIGS. 3A-3D illustrate plan views of a single-channel transistor structure formed as operations in the method 201 are performed, in accordance with an embodiment. A circular guide opening 315 is shown in FIG. 3A, and represents one repeating unit for a 1-D or 2-D array that is printed at operation 205. FIGS. 4A-4D illustrate cross-sectional views of the structures illustrated in FIG. 3A-3D, respectively, along the A'-A line depicted in FIG. 3A. In the exemplary embodiment, the circular guide opening 315 has a critical dimension ($CD_1$) of no more than 20 nm with the polygon edge 306 defining a hole 305 (FIG. 4A) through a thickness of the mask 340, which may be a photoresist or hardmask material. Any conventional resist formulation suitable for the lithography tool employed may be utilized in photoresist embodiments. The mask 340 is disposed over a semiconductor layer having a z-height thickness ($T_1$) corresponding to a desired transistor channel length ($L_g$) that is to provide the channel region of the nanowire transistor. For the exemplary embodiment illustrated in FIG. 4A, the mask 340 is disposed directly on the channel semiconductor layer 315 (e.g., single crystalline silicon, SiGe, etc.), although an intervening material layer, such as a hardmask material layer (e.g., $Si_xN_y$, $SiO_2$, etc.), may be disposed between the photoresist layer 340 and channel semiconductor layer 315.

Figure 3B:
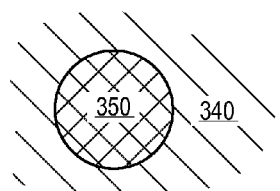
Figure 4B:
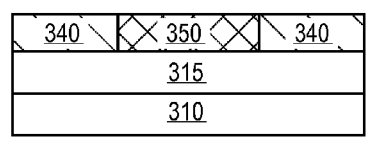
Figure 4C:
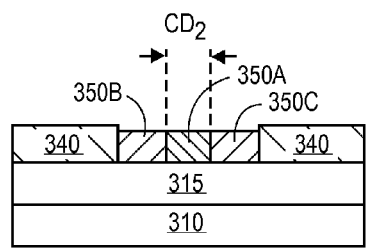
Figure 4D:
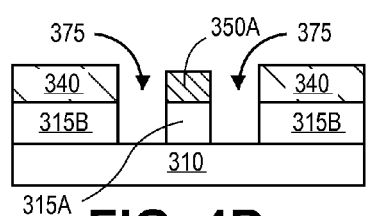

Returning to FIG. 2, the method 201 continues with operation 210 where the DSA material is deposited into the guide opening(s) formed at operation 205. In preparation for application of the DSA material the surface of layer 315 may be treated so that it is equally attractive/repulsive to the polymer A and polymer B. As shown in FIGS. 3B and 4B, a DSA material 350 fills the guide opening 315 and is contained by the guide opening edges 306. The DSA material 350 generally comprises at least first and second polymers (i.e., a polymer A and a polymer B). When applied over the substrate, for example by spin coating, the polymers A and B are in an intermixed state. Beyond the basic chemistry of the polymers A and B, the polymers A and B may each be chosen to have desired distribution of molecular weights and the DSA material 350 may be selected to have a desired polymer A-to-polymer B ratio (A:B), as a function of the geometry and CD of the guide operation 315 and the desired CD of the transistor channel region. While any DSA material known in the art may be utilized, in the exemplary embodiment one of the polymer A and polymer B is present in a photoresist employed as the mask 340. For example, where the mask 340 comprises polystyrene, polymer A or polymer B is also polystyrene. In one such embodiment, the other of the polymers is PMMA (poly (methyl methacrylate)).

The method 201 (FIG. 2) continues with operation 215 where the DSA material is segregated into interior and exterior polymer regions. Segregation of the polymer A from the polymer B occurs while the DSA material 350 is annealed at an elevated temperature for a duration sufficient to permit adequate migration of the polymers, as a function of the dimensions of the guide opening 315, and the molecular weights of the polymers, etc. With the guide opening 315 enclosing the DSA material 350, segregation can be engineered so as one of the polymers (e.g., polymer A) migrates away from the guide edge 306 while the other of the polymers (e.g., polymer B) migrates toward the guide edge 306. An interior polymer region 350A comprising predominantly a first polymer is then completely surrounded by an exterior polymer region 350B comprising predominantly a second polymer. In the exemplary embodiment shown in FIGS. 3C and 4C, the interior polymer region 350A is spaced apart from the guide opening edge to have a diameter of $CD_2$, reduced from that of $CD_1$. For appropriately chosen DSA constituents, under layer and guide opening edge surface properties, the interior polymer region 350A form integer numbers of substantially identical cylinders or spheres embedded within the exterior polymer region 350B. While in the exemplary single channel embodiment illustrated in FIGS. 3A-3E a single interior polymer region 350A is formed, multiples of such regions may be formed where the guide opening is sized sufficiently large in at least one dimension. With the segregation mechanics being a well-controlled function of the co-polymer properties of the DSA material, the interior polymer region(s) maintain a consistent distance from each other and from the guide opening edges. As such, the interior polymer region 350A is effectively self-aligned to the guide opening edge 306.

Following the bake and/or cure performed at operation 215, the method 201 continues to operation 220 where a semiconductor channel region of the transistor is defined within the interior of the guide opening by removing one of the interior and exterior polymer regions selectively to the other. In the exemplary embodiment illustrated in FIGS. 3D and 4D, the exterior polymer region 350B is removed (e.g., dissolved) selectively to the interior polymer region 350A. As further shown, the exterior polymer region 350B is also removed selectively to the mask 340 such that two edges are defined at operation 220: an edge of the interior polymer region 350A, and the guide opening edge 306 with the edge of the interior polymer region 350A being self-aligned to the guide opening edge 306.

An annular trench 375 is then etched through the channel semiconductor layer 315 and the interior polymer region 350A removed, along with the mask 340. The exposed portion of the channel semiconductor layer 325 may be recessed with any etch process known in the art for the given semiconductor material (Si, SiGe, etc.), to form a sidewall of a channel region 315A associated with the transistor $L_g$ aligned with an edge of the interior polymer region 350A. As used herein, "aligned" permits some nominal etch bias (positive or negative) to be incurred which may change the CD of the channel region 315A from that of $CD_2$, but the dimension of the channel region 315A is nevertheless based on that of the interior polymer region 350A and as such, significantly smaller than the dimension of the guide opening ($CD_1$). For example, the sidewalls of the channel region 315A may be aligned to the interior polymer region 350A with an anisotropic etch through the channel region 315A followed by an isotropic etch that recesses the sidewalls of the channel region 315A relative to the CD of the interior polymer region 350A. In one embodiment where the guide opening $CD_1$ is less than 20 nm, the channel region 315A has a $CD_2$ of less than 15 nm. The trench 375 may be stopped on an underlying semiconductor material 310 (e.g., single crystalline Si, SiGe, Ge, etc.), on a basis of compositional etch selectivity or on the basis of a timed etch, for example. Depending on the embodiment, the underlying semiconductor material 310 is either already heavily doped to a particular conductivity typed, may be doped upon its exposure, or is partially removed and regrown as a doped material. In the embodiment illustrated in FIGS. 3D and 4D, the semiconductor material 310 heavily doped to function as a source/drain region (e.g., source/drain region 111A and/or extrinsic source/drain region 111B in FIG. 1).

With the semiconductor channel region defined at operation 220, the method 201 continues with depositing a gate material over a sidewall of the semiconductor channel region at operation 225. Generally, any gate dielectric deposition process known in the art may be performed, including deposition of a sacrificial gate dielectric which is to be subsequently replaced later in the fabrication process (e.g., as in a conventional "gate-last" type process flow). However, in the exemplary embodiment, at operation 225, a non-sacrificial high-k (e.g., >9) gate dielectric 380 is deposited on the semiconductor surface exposed at the bottom of the trench 375 and on the trench sidewalls 380A and 380B. As one example, a metal oxide, such as but not limited to $HfO_2$, or $ZrO_2$, is deposited by atomic layer deposition at operation 225 as the gate dielectric 380.

Figure 3C:
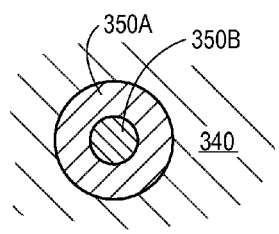
Figure 3D:
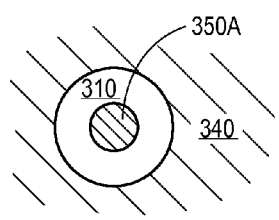
Figure 3E:
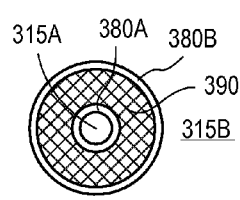
Figure 4E:
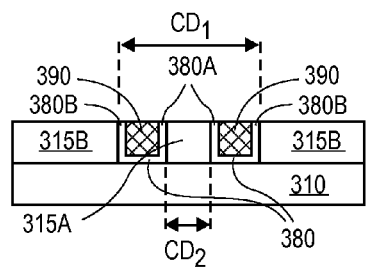

The method 201 then completes with operation 230 where the semiconductor channel region 315A is surrounded with a gate electrode material. In the exemplary embodiment, operation 230 comprises filling the cylindrical trench 375 with a gate electrode material 390. The gate electrode material 390 may include any conventional gate electrode material, such as but not limited to polysilicon, a work function metal, and/or a fill metal. Techniques known in the art, such as but not limited to deposition and polish, may be utilized to planarize the gate electrode material 390 with the channel region 315A, or an overlying hardmask layer. As shown in FIGS. 3E and 4E, the gate dielectric 380 electrically isolates the gate electrode material 390 from the channel region 315A, as well as from the underlying source/drain region 310 and peripheral semiconductor material 315B. Notably, the dimensions of the gate electrode material 390 are therefore fully self-aligned to the guide opening edge 306 as well as self-aligned to the channel region 315A with only the z-height thickness of the gate electrode material 390 left to vary as a function of the desired transistor channel length. The vertical transistor can then be completed with conventional techniques (e.g., deposition or epitaxial growth of the source/drain semiconductor 111D, on the exposed surface of the semiconductor channel region 315A, deposition of contact metallization, etc.).

Figure 5D:
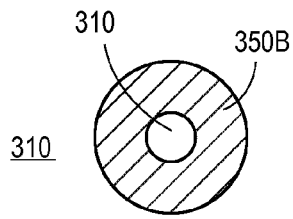
Figure 6D:
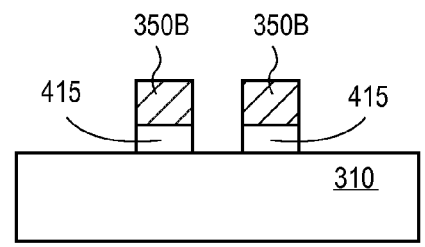
Figure 5E:
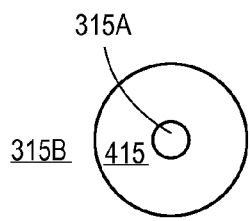
Figure 6E:
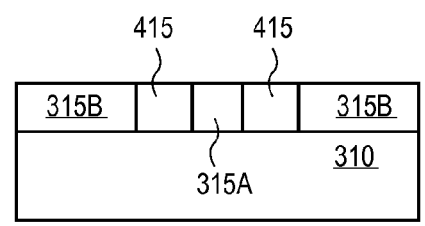

FIGS. 5A-5F illustrate plan views of single-channel structures formed as operations in the method 201 are performed, in accordance with an alternate embodiment. FIGS. 6A-6F illustrate cross-sectional views of the structures illustrated in FIG. 5A-5F, in accordance with an embodiment. Generally, in the embodiment illustrated in FIGS. 5A-5F, operations 205-215 are as were described in the context of FIGS. 3A-3D with the exception that the mask 340 is deposited on a dielectric layer 415 (e.g., $Si_xN_y$, SiON, $SiO_2$, etc.) disposed over the semiconductor layer 310. Following segregation of the co-polymers into the interior polymer region 350A and exterior polymer region 350B, at operation 220 the interior polymer region 350A is removed selectively to the exterior polymer region 350B, as is illustrated in FIGS. 5D and 6D. In this exemplary embodiment, the mask 340 is also removed leaving an annular mask consisting of the exterior polymer region 350B. The dielectric layer 415 is then etched to expose the underlying crystalline surface of the semiconductor material 310. As shown in FIG. 6E, the operation 220 further includes removing the exterior polymer region 350B and epitaxially growing (e.g., with MOCVD, etc.) the semiconductor channel region 315A from the exposed crystalline semiconductor surface with the dielectric layer 415 serving as a growth stopping hardmask. Given the size of the semiconductor channel region 315A (e.g., <15 nm), the grown semiconductor material layer may have advantageously good crystallinity as a result of aspect ratio trapping. After formation of the semiconductor channel region 315A, the second portion of the dielectric layer 415 is recessed to form a cylindrical trench exposing a sidewall of the semiconductor channel region. In the exemplary embodiment depicted, the dielectric layer 415 is completely removed, exposing a surface of the semiconductor layer 310. For one such embodiment, the semiconductor layer 310 is appropriately doped to serve as the source/drain semiconductor region of the nanowire transistor with the channel region 315A then epitaxially grown directly a surface of the source/drain semiconductor region.

Figure 5F:
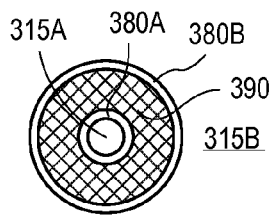
Figure 6F:
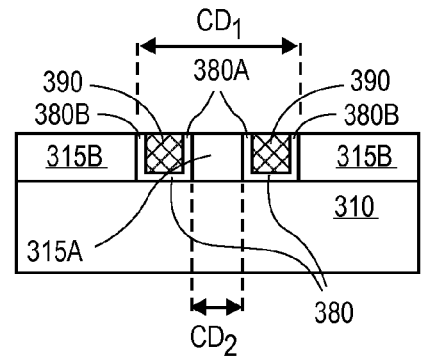

As shown in FIGS. 5F and 6F, the method 201 then continues through operation 225 to form the gate dielectric on the sidewalls 380A, over the semiconductor material layer 310 and on the sidewalls 380B, substantially as is described elsewhere herein in reference to FIGS. 3E and 4E. The gate electrode material 390 is then deposited at operation 230 to again surround the channel region 315A.

Figure 7A:
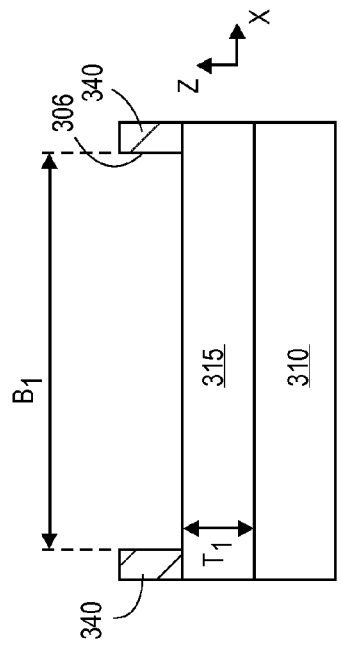
FIGS. 7A, 7B, and 7C illustrate plan views of dual-channel structures formed as operations in the method of FIG. 2 are performed, in accordance with an embodiment.
Figure 8A:
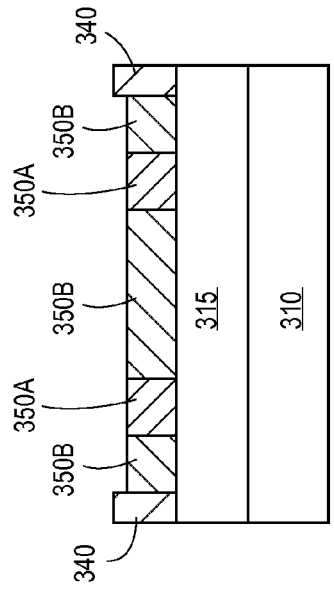
FIGS. 8A, 8B, and 8C illustrate cross-sectional views of the structures illustrated in FIG. 7A-7C, in accordance with an embodiment.
Figure 7B:
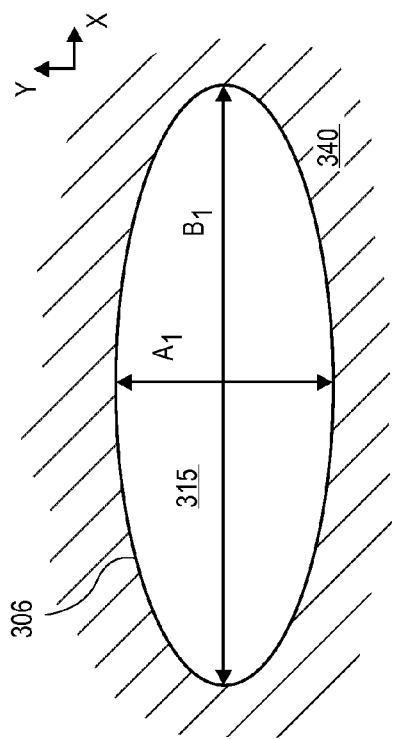
Figure 8B:
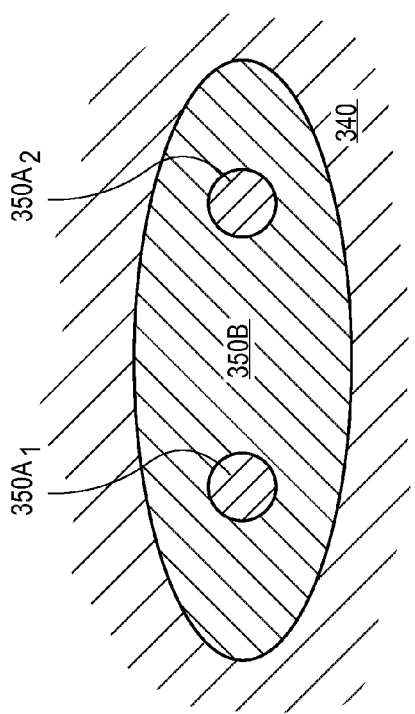
Figure 8C:
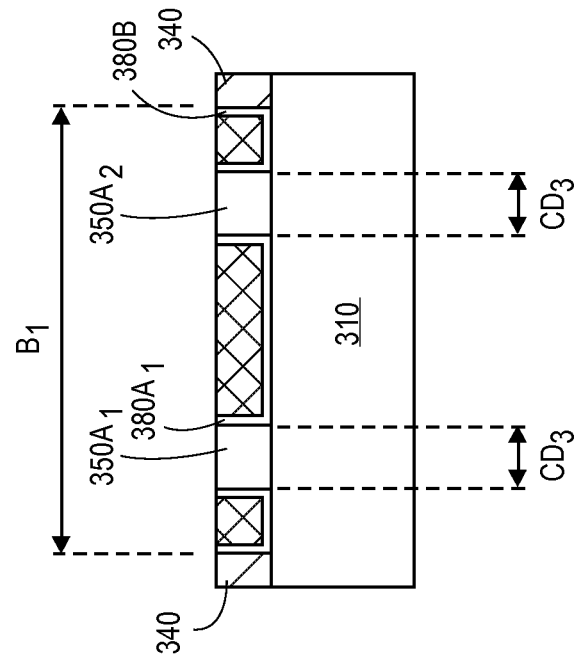
Figure 7C:
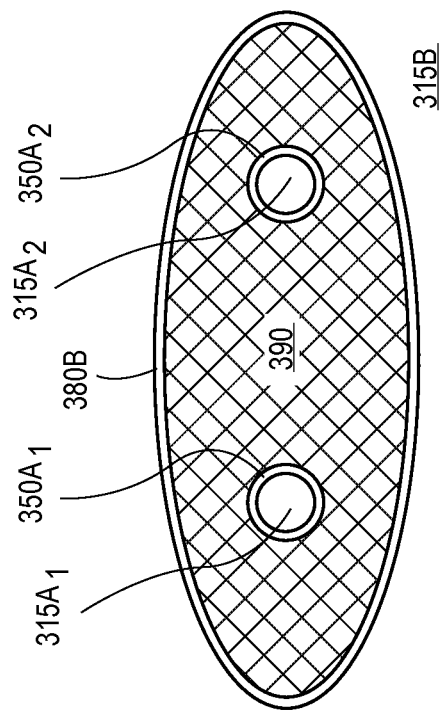

While FIGS. 3A-3E and 4A-4E, as well as FIGS. 5A-5F and 6A-6F, illustrate single channel embodiments of the method 201, FIGS. 7A-7C illustrate plan views of dual-channel structures formed as operations in the method 201 are performed, in accordance with an embodiment. FIGS. 8A-8C further illustrate cross-sectional views of the structures illustrated in FIG. 7A-7C. Generally, the method 201 is practiced substantially as described elsewhere herein for single-channel embodiments with the DSA material defining two (or more) interior polymer regions, each of which becomes the basis for defining a semiconductor channel region of a vertical nanowire transistor. For such multi-channel embodiments, the DSA material is leveraged to self-align the channel regions to a surrounding gate and also reduce pitch between adjacent channel regions relative to the pitch employed to print the guide openings. In exemplary embodiments, the pitch of two adjacent channel regions is below the resolution limit of a scanner employed to print the guide openings.

FIGS. 7A and 8A illustrate the guide opening 315 initially patterned (e.g., printed or etched) into the mask 340 (e.g., at operation 205) is larger in a first dimension (e.g., axis $B_1$) than in a second dimension (e.g., axis $A_1$). Generally, the longer length $B_1$ exceeds a threshold characteristic of the DSA material (e.g., 40 nm) while the shorter length $A_1$ does not (e.g., $A_1$ may be approximately the diameter of a guide opening for a single-channel embodiment (e.g., less than 20 nm). In embodiments, the longer length $B_1$ is at least twice the shorter length $A_1$. For certain surface conditions, such an elongated guide opening 315, when filled with a DSA material having proper co-polymer properties, anneals into the two interior polymer regions $350A_1$ and $350A_2$ illustrated in FIGS. 7B and 8B. Both of the interior polymer regions $350A_1$ and $350A_2$ are surrounded by a contiguous exterior polymer region 350B with the material properties of each segregated region being as described elsewhere herein in the context of single-channel embodiments. Upon segregation, the interior polymer regions $350A_1$ and $350A_2$ have essentially identical dimensions (e.g., $CD_3$ as shown in FIG. 8C). In the exemplary embodiments where the guide opening has at least one dimension that is less than 20 nm, the interior polymer regions $350A_1$ and $350A_2$ each have a width that is less than 15 nm, and in further such embodiments the pitch of the interior polymer regions $350A_1$ and $350A_2$ is also less than 15 nm.

With the plurality of interior polymer regions $350A_1$ and $350A_2$ materially distinguished from the exterior polymer region 350B, the method 201 proceeds through operations 220, 225, 230 substantially as described for single-channel embodiments (e.g., as illustrated either by FIGS. 3A-3E, 4A-4E) to define the channel semiconductor layer 315 into the two channel regions $315A_1$ and $315A_2$ controlled by a shared gate electrode 390 through the gate dielectrics $350A_1$ and $350A_2$, respectively. As such, segregation capabilities of the DSA material may be utilized to make multi-wired vertical transistors which may be individually sized for optimal gate control (reduced short channel effects) while providing a desired amount of drive current (determined by the number of discrete channels formed).

In embodiments, not only are the channel region and gate of a vertical transistor defined based on segregation of a DSA material, so too are other functional regions of the transistor, such as, but not limited to, the source drain regions, as illustrated by the FIGS. 9A-9E and 10A-10G. FIGS. 9A, 9B, 9C, 9D, and 9E illustrate cross-sectional views of single-channel structures formed as operations in the method of FIG. 2B are performed, in accordance with an embodiment. Generally, in this exemplary embodiment, source/drain regions, as well as the channel region, of a vertical nanowire transistor are regrown in regions defined by segregation of a DSA material.

Figure 9A:
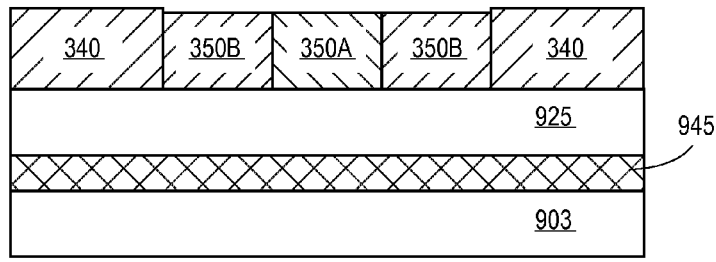
FIGS. 9A, 9B, 9C, 9D, and 9E illustrate cross-sectional views of single-channel structures formed as operations in the method of FIG. 2 are performed, in accordance with an embodiment.
Figure 9B:
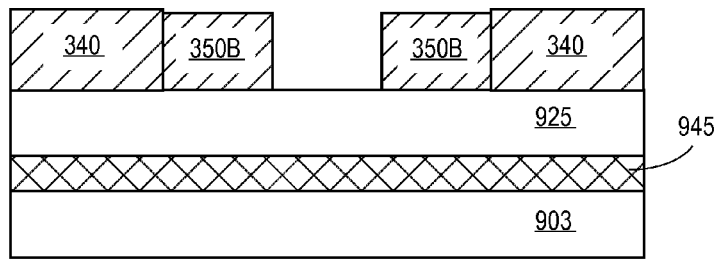
Figure 9C:
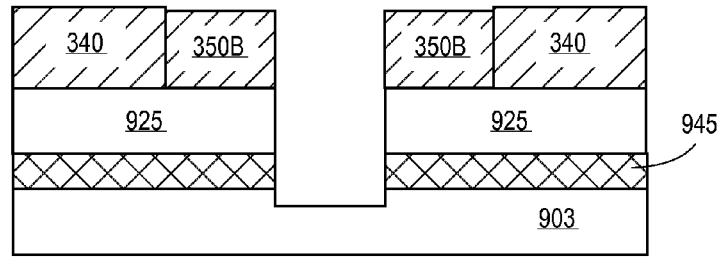
Figure 9D:
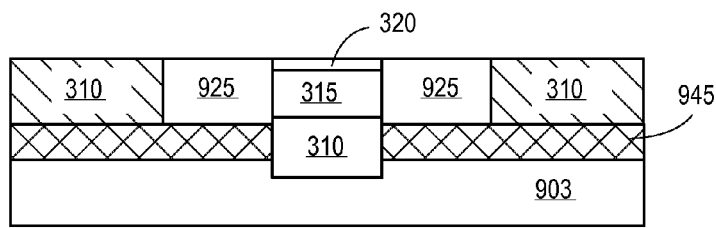

FIG. 9A begins at the completion of operation 215 where DSA material has been segregated in the interior polymer region 350A and exterior polymer region 350B. The substrate in this embodiment includes a dielectric layer 925 disposed over a degenerately doped semiconductor layer 945, that is further disposed over a crystalline semiconductor substrate layer 903. The interior polymer region 350A is removed selectively to the exterior polymer region 350B, as described elsewhere herein, and also selectively to the mask 340, as shown in FIG. 9B. An interior trench is then etched through the dielectric layer 925 and the layer 945 in the region where the interior polymer region 350A was removed to expose the semiconductor 903. With the mask 340 then removed, a peripheral portion of the dielectric layer 925 is removed to leave an annular perimeter of dielectric 925 surrounding the interior trench. A selective epitaxial process is then employed to form the nanowire transistor from the seeding surface of the exposed semiconductor substrate layer 903 within the interior trench and periphery region. As shown in FIG. 9D, a first (bottom) crystalline source/drain semiconductor layer 310 is grown from the semiconductor substrate layer 903 and from the semiconductor layer 945. Regrowth of the source/drain semiconductor layer 310 may improve crystallinity in the channel region subsequently grown as advantageous defect trapping may occur in the source/drain semiconductor layer 310. Furthermore, regrowth of the source/drain semiconductor layer 310 serves to selectively form a connection to the now embedded conductive semiconductor layer 945 with crystalline or polycrystalline semiconductor formed over the semiconductor layer 945. A semiconductor channel region 315 is then epitaxially grown from the source/drain semiconductor layer 310. A second (top) source/drain semiconductor layer 320 is further grown over the semiconductor channel region 315. The regrown film is polished back to planarize against the dielectric layer 925 as a polish stop. Due to initial non-planarity between the interior trench and the periphery, the planarization process removes the regrown semiconductor in the periphery back to the bottom source/drain semiconductor layer 310 while the top source/drain semiconductor layer 320 is retaining in the interior region as a portion of the vertical nanowire transistor.

Figure 9E:
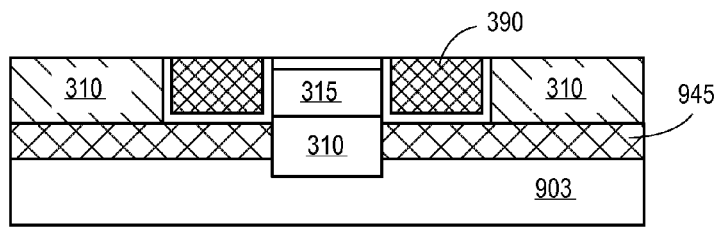

The gate dielectric is formed at operation 220 by first recessing the annular portion of the dielectric layer 925 remaining where the exterior polymer region 350B was originally disposed. This exposes a sidewall of the semiconductor channel region 315. The dielectric layer 925 may be completely recessed with an etch selective to the underlying conductive layer 945, in which case the gate dielectric formed at operation 225 serves to insulate the gate electrode material 390 from the conductive layer 945. Alternatively, the dielectric layer 925 may be recessed only partially (e.g., with a timed etch back) to increase the thickness of dielectric between the gate electrode material 390 and underlying conductive layer 945. As such, the top surface of the vertical nanowire transistor structure illustrated in FIG. 9E is planarized and provides top-side access to all functional regions of the transistor for contact (e.g., silicidation) and interconnect metallization.

Figure 10A:
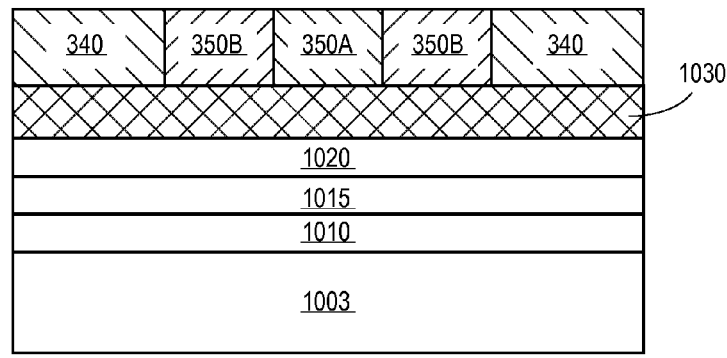
FIGS. 10A, 10B, 10C, 10D, 10E, 10F and 10G illustrate cross-sectional views of single-channel structures formed as operations in the method of FIG. 2 are performed, in accordance with an embodiment.

FIGS. 10A, 10B, 10C, 10D, and 10E illustrate cross-sectional views of single-channel structures formed as operations in the method of FIG. 2B are performed, in accordance with an embodiment. In this exemplary embodiment, a stack of semiconductor materials including two source/drain layers and a channel layer are etched based on a DSA material. This embodiment may therefore be considered a special case of the embodiment illustrated by FIGS. 3A-3E, 4A-4E. FIG. 10A begins with the DSA material segregated into the interior and exterior polymer regions 350A, 350B. The substrate includes a semiconductor material layer stack including compositionally distinct (through either doping or differing lattice atoms) material layers. For the exemplary embodiment, the semiconductor material stack includes a bottom source/drain layer 1010 disposed on a substrate 1003, a channel layer 1015 disposed on the bottom source/drain layer 1010, and a top source/drain layer 1020 disposed over the channel layer 1015. Disposed over the semiconductor stack is a dielectric (hardmask) layer 1030.

Figure 10B:
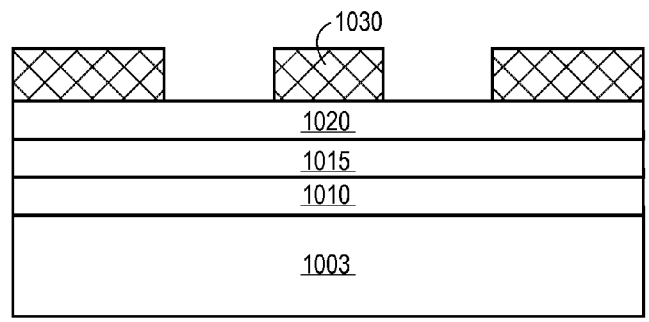
Figure 10C:
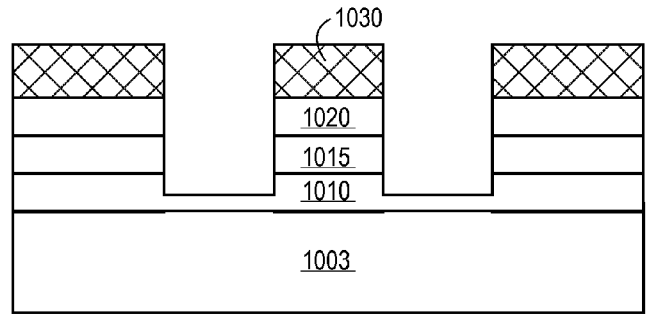
Figure 10D:
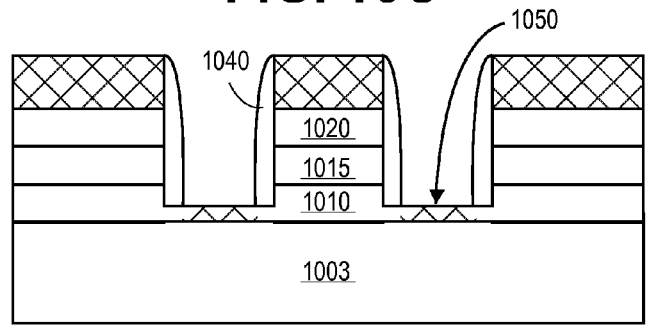
Figure 10E:
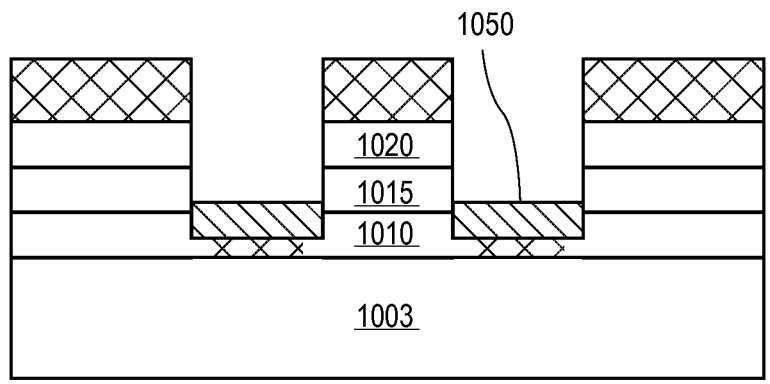
Figure 10F:
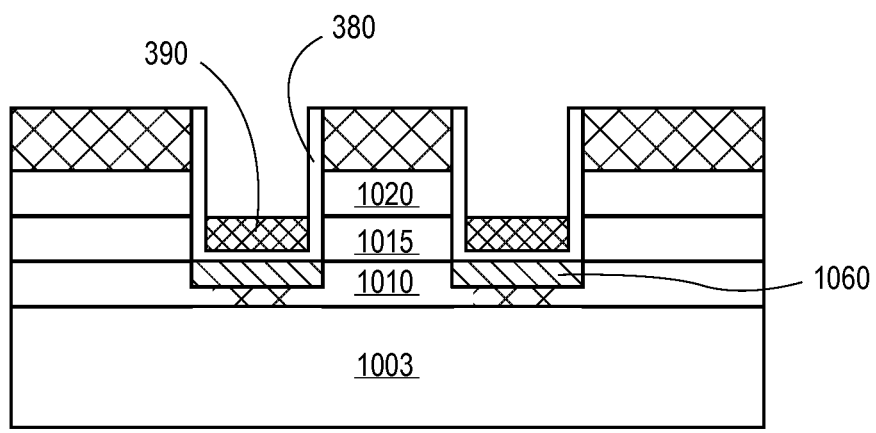
Figure 10G:
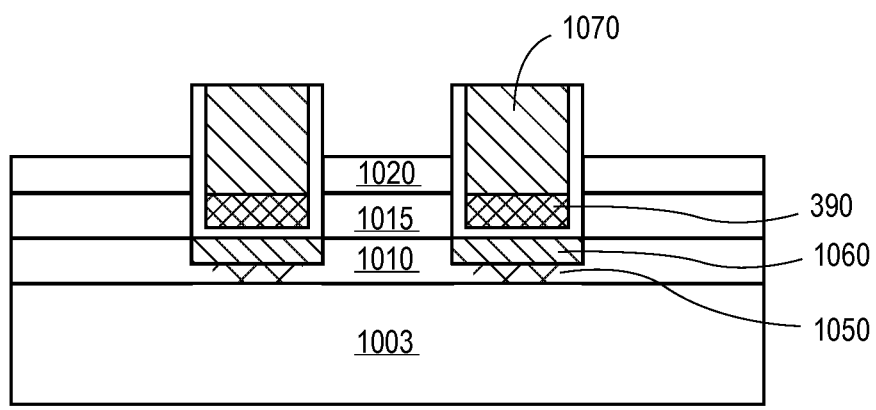

As shown in FIG. 10B, the exterior polymer region 350B is removed selectively to the interior polymer region 350A and the mask 340. An annular trench is then etched through most of the stack to expose the bottom source/drain layer 1010, as shown in FIG. 10C. A dielectric spacer 1040 (FIG. 10D) is formed along sidewalls of the semiconductor stacks and a silicide 1050 is formed on the exposed both source/drain layer 1010. Dielectric material 1060 is then deposited within the trench, planarized, and recessed (etched back) to a z-height (thickness) sufficient to re-expose the channel region sidewall. An isotropic etch removes the dielectric spacer 1040 and the gate dielectric 380 is deposited in the trench over the recessed dielectric material 1060 an on the channel semiconductor sidewall. The gate electrode material is then deposited in the trench, planarized with a top surface of the dielectric 1030 and then recess etched to a z-height (thickness) sufficient to control the channel region. Finally, a dielectric 1070 is deposited in the trench, planarized with the top surface of the dielectric 1030. The dielectric 1030 may then be removed selectively to the dielectric 1070 to expose the top source/drain 1020 in preparation for contact metallization. Hence, the vertically-oriented nanowire transistor with sub-lithographic wire dimensions (e.g., <15 nm) are self-alignedly fabricated, along with local interconnects, on the basis of a single lithographic mask and DSA material.

Figure 11:
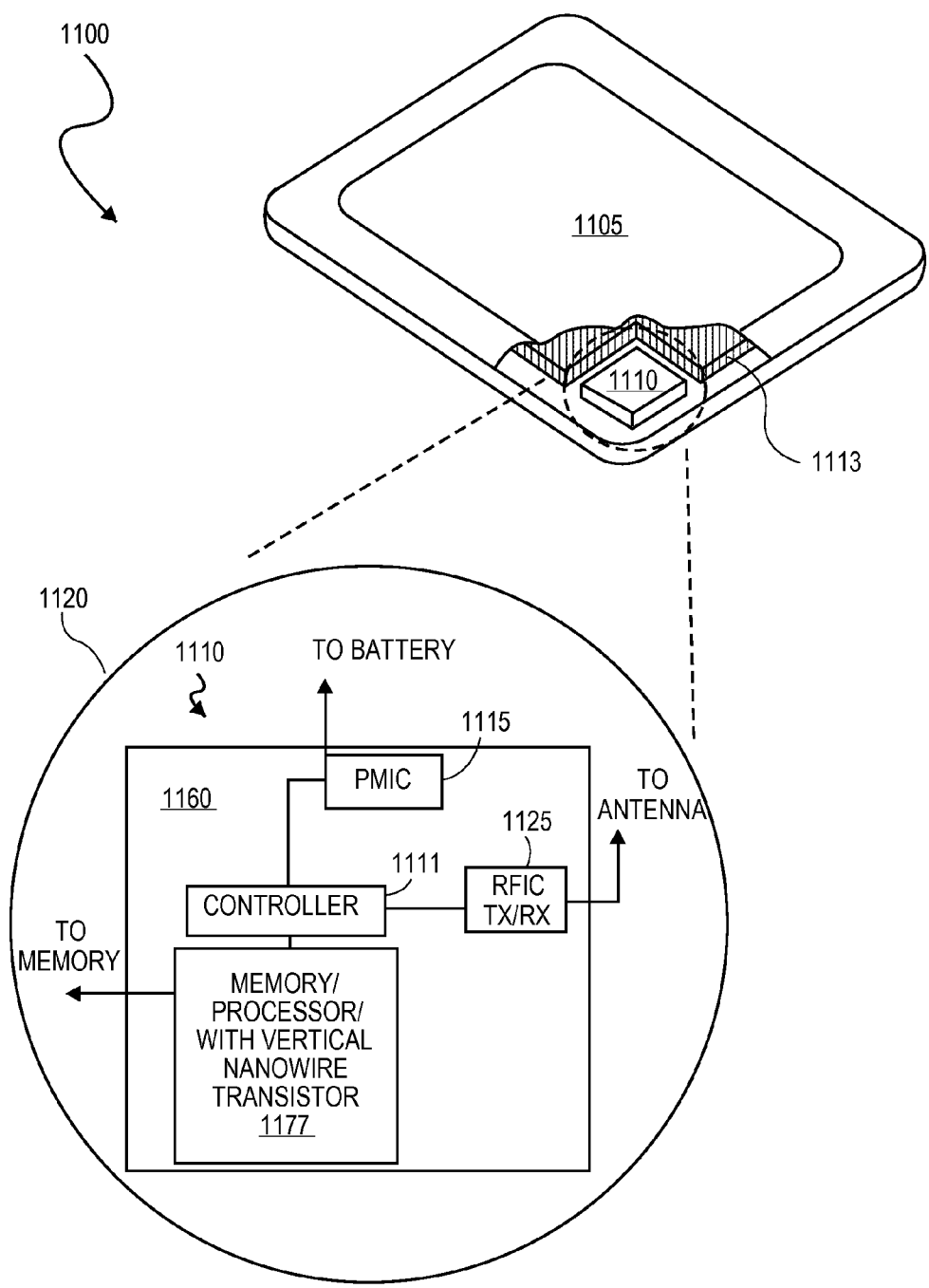
FIG. 11 is a functional block diagram of a mobile computing platform employing non-planar transistors, in accordance with an embodiment of the present invention.

FIG. 11 is a functional block diagram of a SOC implementation of a mobile computing platform, in accordance with an embodiment of the present invention. The mobile computing platform 1100 may be any portable device configured for each of electronic data display, electronic data processing, and wireless electronic data transmission. For example, mobile computing platform 1100 may be any of a tablet, a smart phone, laptop computer, etc. and includes a display screen 1105, the SOC 1110, and a battery 1115. As illustrated, the greater the level of integration of the SOC 1110, the more of the form factor within the mobile computing device 1100 that may be occupied by the battery 1115 for longest operative lifetimes between charging, or occupied by memory (not depicted), such as a solid state drive, DRAM, etc., for greatest platform functionality.

The SOC 1110 is further illustrated in the expanded view 1120. Depending on the embodiment, the SOC 1110 includes a portion of a silicon substrate 1160 (i.e., a chip) upon which one or more of a power management integrated circuit (PMIC) 1115, RF integrated circuit (RFIC) 1125 including an RF transmitter and/or receiver, a controller thereof 1111, and one or more central processor core, or memory 1177. In embodiments, the SOC 1110 includes one or more vertical nanowire transistors (FETs) in conformance with one or more of the embodiments described herein. In further embodiments, manufacture of the SOC 1110 includes one or more of the methods described herein for fabricating a vertically-oriented nanowire transistor (FET).

Figure 12:
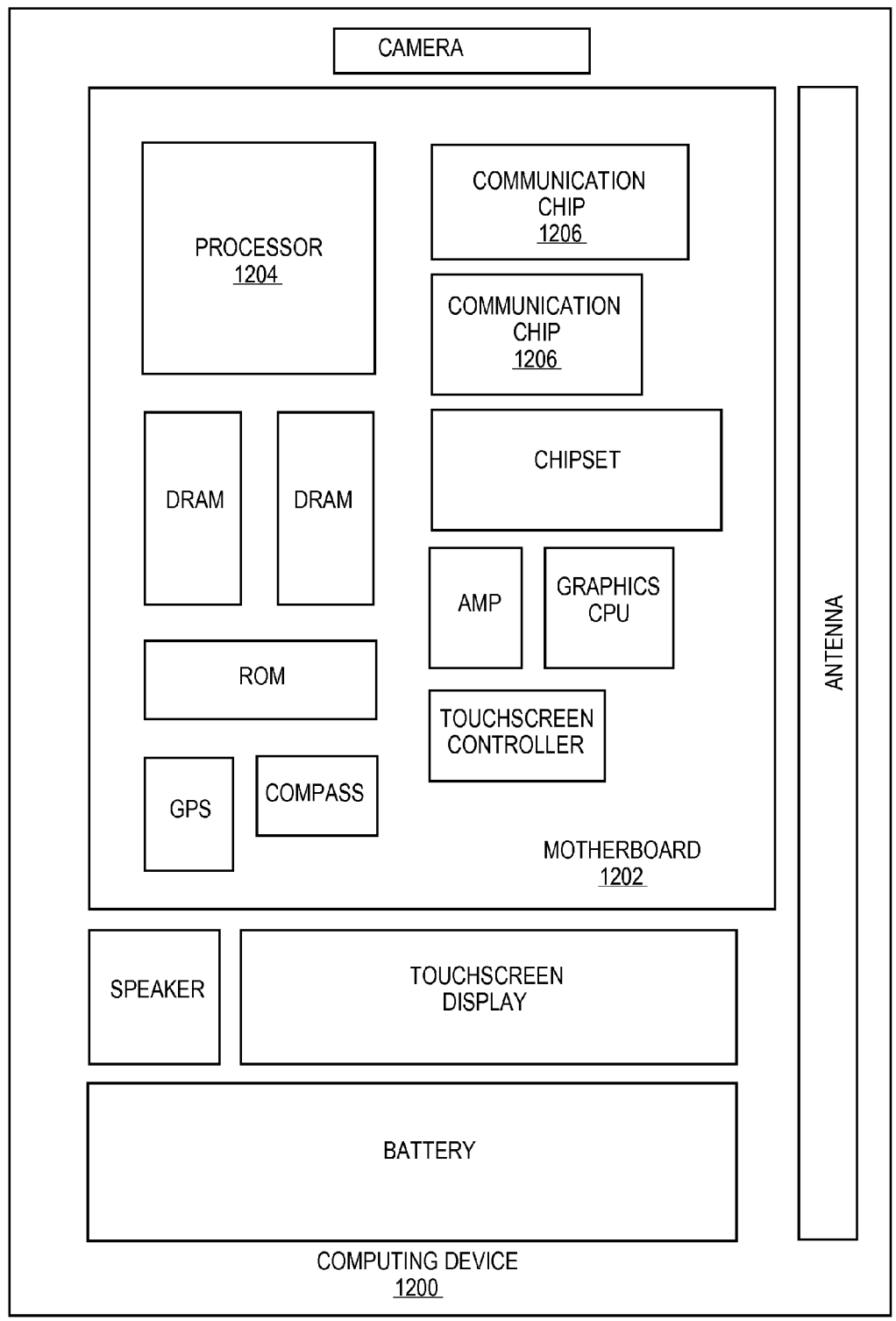
FIG. 12 illustrates a functional block diagram of computing device in accordance with one embodiment.

FIG. 12 is a functional block diagram of a computing device 1200 in accordance with one embodiment of the invention. The computing device 1200 may be found inside the platform 1100, for example, and further includes a board 1202 hosting a number of components, such as but not limited to a processor 1204 (e.g., an applications processor) and at least one communication chip 1206. In embodiments, at least the processor 1204 includes a vertical nanowire transistor (FET) having structures in accordance with embodiments describe elsewhere herein, and/or fabricated in accordance with embodiments further described elsewhere herein. The processor 1204 is physically and electrically coupled to the board 1202. The processor 1204 includes an integrated circuit die packaged within the processor 1204. The term "processor" may refer to any device or portion of a device that processes electronic data from registers and/or memory to transform that electronic data into other electronic data that may be stored in registers and/or memory.

In some implementations the at least one communication chip 1206 is also physically and electrically coupled to the board 1202. In further implementations, the communication chip 1206 is part of the processor 1204. Depending on its applications, computing device 1200 may include other components that may or may not be physically and electrically coupled to the board 1202. These other components include, but are not limited to, volatile memory (e.g., DRAM), non-volatile memory (e.g., RAM or ROM) in the form of flash memory or STTM, etc., a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid state drive (SSD), compact disk (CD), and so forth).

At least one of the communication chips 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to those described elsewhere herein. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of forming a nanowire transistor on a substrate, the method comprising:
   lithographically patterning a guide opening of a first diameter in a mask layer disposed over a source/drain semiconductor layer of the transistor;
   depositing a directed self-assembly (DSA) material into the guide opening;
   segregating the DSA material into an interior polymer region completely surrounded by an exterior polymer region within the guide opening by baking and/or curing;
   defining a semiconductor channel region of the transistor within the guide opening by removing one of the interior and exterior polymer regions selectively to the other, wherein the channel region diameter and spacing from an edge of the guide opening are both defined by the DSA segregation;
   removing the other of the interior and exterior polymer regions;
   depositing a gate dielectric over the semiconductor channel region; and
   surrounding the semiconductor channel region with an annular gate electrode having an outer diameter self-aligned to the guide opening.

2. The method of claim 1, wherein defining the semiconductor channel region further comprises:
   removing the exterior polymer region while retaining the interior polymer region to expose a portion of a channel semiconductor layer; and
   recessing the exposed portion of the channel semiconductor layer to form a cylindrical trench having a channel semiconductor sidewall associated with a channel length of the transistor aligned with an edge of the interior polymer region.

3. The method of claim 2, wherein the recessing exposes a source/drain semiconductor region of the transistor, and wherein the gate dielectric isolates the source/drain semiconductor region from the gate electrode material.

4. The method of claim 2, wherein depositing a gate dielectric over the semiconductor channel region further comprises depositing the gate dielectric into the cylindrical trench and covering the channel semiconductor sidewall; and
   wherein surrounding the semiconductor channel region with the gate electrode comprises filling the cylindrical trench with a gate electrode material.

5. The method of claim 1, wherein defining the semiconductor channel region further comprises:
   removing the interior polymer region while retaining the exterior polymer region to expose an underlying first portion of a dielectric layer;
   etching a trench in the exposed first portion of the dielectric layer to expose a crystalline semiconductor surface; and
   epitaxially growing the semiconductor channel region from the exposed crystalline semiconductor surface; and
   recessing a second portion of the dielectric layer adjacent to the semiconductor channel region to form a cylindrical trench exposing a sidewall of the semiconductor channel region.

6. The method of claim 5, wherein the crystalline semiconductor surface is a surface of a source/drain semiconductor region of the transistor.

7. The method of claim 5, wherein the crystalline semiconductor surface is a surface of an undoped or lightly doped semiconductor substrate, and wherein epitaxially growing the semiconductor channel region further comprises first growing a source/drain semiconductor region of the transistor from the surface of the semiconductor substrate and then growing the semiconductor channel region from the source/drain semiconductor region.

8. The method of claim 5, wherein depositing a gate dielectric over the semiconductor channel region further comprises depositing the gate dielectric into the cylindrical trench and covering the channel semiconductor sidewall; and
   wherein surrounding the semiconductor channel region with the gate electrode comprises filling the cylindrical trench with a gate electrode material.

9. The method of claim 8, wherein the gate dielectric is deposited over the recessed second portion of the dielectric layer.

10. The method of claim 1, wherein lithographically patterning a guide opening further comprises printing an opening having a first diameter in a first dimension and a second diameter in a second dimension, the second diameter being at least twice the first diameter;
    wherein segregating the DSA material into the interior polymer region completely surrounded by the exterior polymer region within the guide opening further comprises forming first and second polymer regions, each completely surrounded by the exterior polymer region; and
    wherein defining the semiconductor channel region further comprises forming and first and second channel region, each channel region having a diameter and a spacing from an edge of the guide opening defined by the DSA segregation.

11. The method of claim 1, wherein depositing the DSA material into the guide opening further comprises spin coating a DSA material comprising first and second polymeric materials; and
    wherein segregating the DSA material further comprises curing the DSA material at a temperature and for a duration sufficient to permit the first polymeric material to migrate into the interior polymer portion while the second polymeric material migrates into the exterior polymer portion.

12. The method of claim 11, wherein one of the first and second polymeric materials comprises PMMA.

13. The method of claim 12, wherein the other of the first and second polymeric material comprises polystyrene.

14. The method of claim 11, wherein the mask layer comprises one of the first and second polymeric materials.

15. A method of forming a nanowire transistor on a substrate, the method comprising:
    lithographically patterning a guide opening of a first diameter in a mask layer disposed over a source/drain semiconductor layer of the transistor;
    depositing a directed self-assembly (DSA) material into the guide opening;
    segregating the DSA material into an interior polymer region completely surrounded by an exterior polymer region within the guide opening by baking and/or curing;
    removing the exterior polymer region selectively to the interior polymer region to form a cylindrical trench exposing an underlying hardmask layer;

etching through the hardmask layer to advance the trench and expose a first semiconductor source/drain region;

etching through the exposed portion of the first semiconductor source/drain region to advance the trench and expose a semiconductor channel layer disposed below the source/drain region;

etching the exposed portion of the semiconductor channel layer to advance the trench and expose a semiconductor layer disposed below the semiconductor channel layer;

filling the trench with a first dielectric material and etching back the first dielectric material selectively relative to the hardmask layer to expose a sidewall of the semiconductor channel layer;

depositing a gate dielectric over the sidewall; and filling the trench with a gate electrode material to surround the sidewall with an annular gate electrode having an outer diameter self-aligned to the guide opening.

16. The method of claim 15, further comprising forming a silicide of the semiconductor layer disposed below the semiconductor channel layer prior to filling the trench with the dielectric.

17. The method of claim 16, further comprising:

etching the gate electrode material back relative to the hardmask layer to expose a sidewall of the first semiconductor source/drain region, and filling the trench with a second dielectric material and planarizing the second dielectric material to a surface of the hardmask layer;

removing the hardmask layer selectively the second dielectric material to expose a surface of the first semiconductor source/drain region; and depositing a contact metal on the exposed surface of the first semiconductor source/drain region.

18. The method of claim 15, wherein depositing the DSA material into the guide opening further comprises spin coating a DSA material comprising first and second polymeric materials; and wherein segregating the DSA material further comprises curing the DSA material at a temperature and for a duration sufficient to permit the first polymeric material to migrate into the interior polymer portion while the second polymeric material migrates into the exterior polymer portion.

19. The method of claim 18, wherein one of the first and second polymeric materials comprises PMMA.

20. The method of claim 19, wherein the other of the first and second polymeric material comprises polystyrene.

21. A method of forming a transistor with a plurality of nanowires, the method comprising:

lithographically patterning a guide opening of a first diameter in a mask layer disposed over a source/drain semiconductor layer of the transistor, the guide opening having a length greater than a width;

depositing a directed self-assembly (DSA) material into the guide opening;

segregating the DSA material into first and second interior polymer regions completely surrounded by a contiguous exterior polymer region within the guide opening by baking and/or curing;

defining two semiconductor channel regions within the guide opening by removing the exterior polymer regions selectively to the interior polymer regions, wherein a diameter of the channel regions, spacing between the channel regions, and spacing from an edge of the guide opening are all defined by the DSA segregation;

recessing the exposed portion of the channel semiconductor layer to form two channel semiconductor sidewalls associated with a channel length of the transistor;

removing the interior polymer region;

depositing a gate dielectric over the semiconductor channel sidewalls; and surrounding the semiconductor channel regions with annular gate electrode having an outer diameter self-aligned to the guide opening.

22. The method of claim 21, wherein depositing the DSA material into the guide opening further comprises spin coating a DSA material comprising first and second polymeric materials; and wherein segregating the DSA material further comprises curing the DSA material at a temperature and for a duration sufficient to permit the first polymeric material to migrate into the interior polymer portion while the second polymeric material migrates into the exterior polymer portion.

23. The method of claim 22, wherein the DSA material comprises PMMA and polystyrene.

* * * * *